United States Patent [19]

Ravid

[11] Patent Number: 5,007,846
[45] Date of Patent: Apr. 16, 1991

[54] SPECIALIZED FRAME FOR RETAINING AN EDGE CONNECTOR ON A PRINTED CIRCUIT BOARD

[76] Inventor: Gonen Ravid, 29034 Acanthus Ct., Agoura Hills, Calif. 91301

[21] Appl. No.: 536,963

[22] Filed: Jun. 11, 1990

[51] Int. Cl.⁵ .......................................... H01R 23/70
[52] U.S. Cl. ...................................... 439/79; 439/173
[58] Field of Search ...................... 439/79, 80, 67, 77, 439/170–175; 361/413, 415; 324/158 F

[56] References Cited

U.S. PATENT DOCUMENTS

| | | | |
|---|---|---|---|
| 3,205,408 | 9/1965 | Boehm et al. | 439/559 |
| 3,723,943 | 3/1973 | Hotze | 439/72 |
| 3,953,797 | 4/1976 | Bally Berard | 324/158 F |
| 4,468,616 | 8/1984 | Yoshizaki | 324/158 F |
| 4,476,433 | 10/1984 | Logan | 324/158 P |
| 4,573,756 | 3/1986 | Smith | 324/158 F |
| 4,686,607 | 8/1987 | Johnson | 361/413 |
| 4,703,394 | 10/1987 | Petit et al. | 361/413 |
| 4,939,454 | 7/1990 | Miner | 324/158 F |

Primary Examiner—Neil Abrams
Attorney, Agent, or Firm—Thomas I. Rozsa

[57] ABSTRACT

An improved mounting and housing of edge connector assemblies used in conjunction with printed circuit boards, which improvement combines the advantages of a flexible cable connector in accommodating any desired locations of the male prongs of the disk drive or another computer peripheral such or a tape drive, floppy drive, optical drive, etc. with the edge connector advantages of easy slidable connecting motion and elimination of the problem of plugging in the connector backwards. A pair of spaced apart elongated slots are formed in the test printed circuit board adjacent one edge of the board. Two edge connectors are supported by two separate frame members with one edge connector in the first frame member and the second edge connector in the second frame member, and the first frame member and edge connector supported therein is slidably attached at any given location along the length of one of the slots while the second frame member and edge connector supported therein is slidably attached at any given location along the length of the other slot. Then the two frame members and edge connectors supported therein can be moved to any desired location along the length of their respective slots to thereby accommodate the locations of the pair of mating male prongs of the disk drive to be tested.

13 Claims, 1 Drawing Sheet

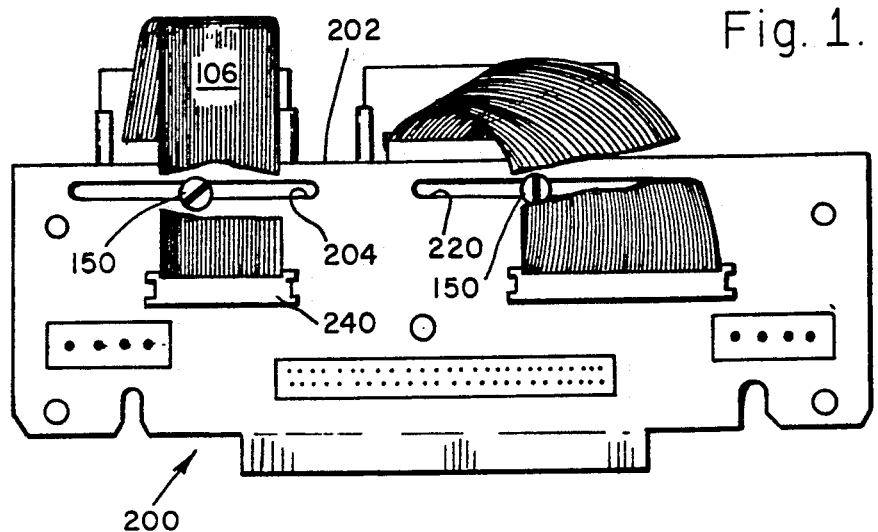
Fig. 1.
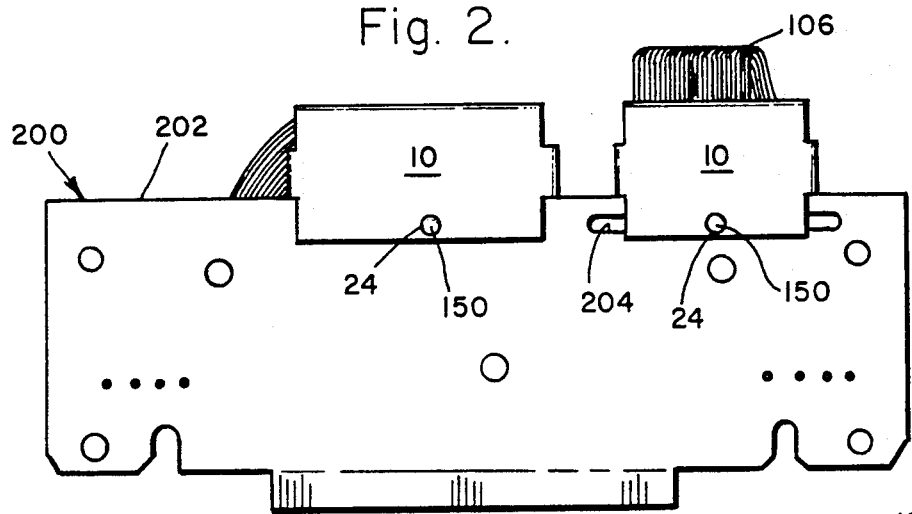
Fig. 2.
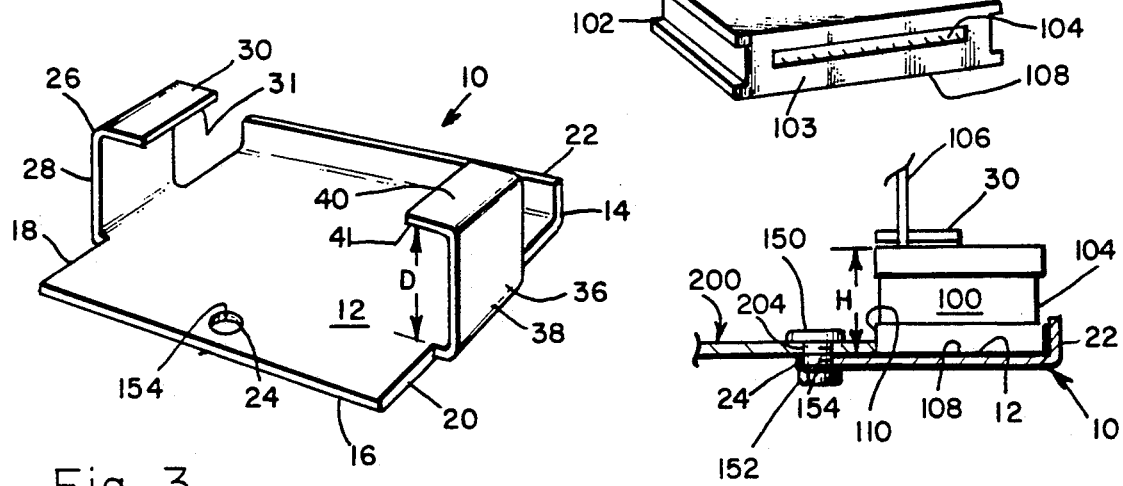
Fig. 3.
Fig. 5.
Fig. 4.

SPECIALIZED FRAME FOR RETAINING AN EDGE CONNECTOR ON A PRINTED CIRCUIT BOARD

BACKGROUND OF THE INVENTION

1. Field of the Invention

The present invention relates to improvements in the mounting and housing of edge connector assemblies used in conjunction with printed circuit boards. The edge connector is used to connect a disk drive, or another computer peripheral such as a tape drive, floppy drive, optical drive, etc. to the printed circuit board.

2. Description of the Prior Art

When testing and preparing a disk drive prior to final assembly, it is necessary to plug the disk drive into a test system. In the prior art, two conventional plug in assemblies are used. The most common assembly is a flexible cable which has a mating female plug member at one end to accommodate the male fingers from the disk drive and a PC joining plug at the other end of the cable to plug into the printed circuit board in the computer. While the flexible cable provides a flexible connector assembly to accommodate various disk drives, it also presents several problems. First, when testing a lot of disk drives, the constant motion of plugging the flexible cable into one drive after another creates a substantial possibility of damaging the cables or the mating prongs or pins on the disk drives. In addition, a second problem is the likelihood that the cable will be plugged in backwards, causing faulty readings and possible power shortages. Plugging in the cable backwards may also damage the disk drive or the computer printed circuit board.

Another common assembly is a fixed edge connector which is attached to the test printed circuit board at a location adjacent one edge, with the mating female openings aligned with the edge and ready to receive the male prongs or pins from the disk drive. This method of connection is a substantial improvement over the flexible cable because it allows for a simple sliding motion of the male prongs of the disk drive into the female openings of the edge connector, thereby substantially reducing the possibility of damaging either the edge connector or the disk drive prongs. It also eliminates the possibility of plugging in the edge connector backwards into the disk drive. One drawback with the fixed edge connector is that the location of the mating male prongs on the disk drive are not always the same from one drive to the next. With the flexible cable this is not a problem because the connector member of the cable can be easily moved to the location of the mating male prongs of the disk drive. With a fixed pair of edge connectors, such movement is not possible. A typical test printed circuit board has two spaced apart edge connectors, which utilizes any combination of two from 20, 34 and 50 pin connectors. Since the mating prongs of different disk drives are spaced at different locations, the prongs from one disk drive may be accommodated in a given test printed circuit board with two fixed edge connectors which pin size matches the prongs from the disk drive. Therefore, it is necessary to have a multiplicity of different test printed circuit boards with the various combinations of correct pin numbers and spaced apart location of the two edge connectors to accommodate the various disk drive prong configurations.

Therefore, a significant need exists for a connector assembly which combines the advantages of a flexible cable connector in accommodating any desired locations of the male prongs of the disk drive with the edge connector advantages of easy slidable connecting motion and elimination of the problem of plugging in the connector backwards.

SUMMARY OF THE PRESENT INVENTION

The present invention is an improved mounting and housing of edge connector assemblies used in conjunction with printed circuit boards, which improvement combines the advantages of a flexible cable connector in accommodating any desired locations of the male prongs of the disk drive with the edge connector advantages of easy slidable connecting motion and elimination of the problem of plugging in the connector backwards.

It has been discovered, according to the present invention, that if a slot is formed in the test printed circuit board adjacent one edge of the board and the edge connector is supported by a frame member having securing means such as a nut and bolt which enable the edge connector to be slidably attached at any given location along the length of the slot, then the frame member and edge connector supported therein can be moved to any desired location along the length of the slot thereby accommodating the location of the mating male prongs of the disk drive to be tested.

It has further been discovered, according to the present invention, that if an elongated slot is formed in the test printed circuit board adjacent one edge of the board and two edge connectors are supported by two separate frame members with one edge connector in the first frame member and the second edge connector in the second frame member, and the first frame member and edge connector supported therein is slidably attached at any given location along the length of the slot while the second frame member and edge connector supported therein is slidably attached at any given location along the length of the slot, then the two frame members and edge connectors supported therein can be moved to any desired location along the length of the slot to thereby accommodate the locations of the pair of mating male prongs of the disk drive to be tested.

It has further been discovered, according to the present invention, that if the frame member comprises a front lip to prevent the edge connector form sliding forward and out of the frame member and is mounted on the printed circuit board in a manner which enables the bottom of the frame member to be affixed below the printed circuit board, then the adjacent edge of the printed circuit board acts as a back lip to further prevent the edge connector retained by the frame from sliding out of the back of the frame member.

It has additionally been discovered, according to the present invention, that if a pair of bracket members act as respective sidewalls on the frame member, then the bracket members serve to retain the edge connector within the frame and prevent it from sliding out either side of the frame. Additionally, if each bracket sidewall member further comprises an upper member aligned with the top surface of the edge connector, then the edge connector cannot be removed from or fall out of the frame while the frame member is affixed to the printed circuit board.

It is therefore an object of the present invention to provide a slidable frame retaining means and housing for an edge connector which enables the edge connector to be moved to any given location along the length of a test printed circuit board to thereby permit the edge connector to be aligned with the given male prong of a disk drive to be tested.

It is a further object of the present invention to provide a pair of slidable frame retaining means and housing therefor for a pair of edge connectors which enables the edge connectors to be moved to any given location along the length of the test printed circuit board so that the edge connectors may be aligned with the pair of male prongs of a disk drive to be tested.

It is an additional object of the present invention to provide a frame for each edge connector which is affixed to the printed circuit board in a manner which assures that the frame wills securely retain the edge connector and at the same time permits the cable from the edge connector to extend to the power and signals source.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated:

FIG. 1 is a top plan view of a printed circuit board with two edge connectors retained thereon by a pair of the present invention specialized frames for retaining an edge connector on a printed circuit board.

FIG. 2 is a bottom plan view of a printed circuit board with two edge connectors retained thereon by a pair of the present invention specialized frames for retaining an edge connector on a printed circuit board.

FIG. 3 is a perspective view of the present invention specialized frame for retaining an edge connector on a printed circuit board.

FIG. 4 is a side elevational view in partial cross-section of an edge connector retained in the present invention specialized frame for retaining an edge connector which frame is in turn affixed to a printed circuit board.

FIG. 5 is a perspective view of an edge connector used with the present invention.

DETAILED DESCRIPTION OF THE PREFERRED EMBODIMENT

Although specific embodiments of the invention will now be described with reference to the drawings, it should be understood that such embodiments are by way of example only and merely illustrative of but a small number of the many possible specific embodiments which can represent applications of the principles of the invention. Various changes and modifications obvious to one skilled in the art to which the invention pertains are deemed to be within the spirit, scope and contemplation of the invention as further defined in the appended claims.

Referring particularly to FIG. 3, there is illustrated at 10 the present invention specialized frame. The specialized frame 10 comprises a bottom 12 having a front edge 14, a rear edge 16, a first side edge 18 and a second side edge 20. Frame 10 further comprises a transverse front lip 22 which is affixed along the front edge 14 and extends generally perpendicular to bottom 12 to thereby provide a barrier along front edge 14 of bottom 12. A transverse opening 24 extends through the entire thickness of bottom 12 and is adjacent rear edge 16. In the preferred embodiment, transverse opening 24 is positioned at the approximate midlength point of the bottom 12. Frame 10 further comprises a pair of side brackets affixed along the respective side edges of the bottom 12. First bracket 26 comprises a sidewall 28 which is affixed along first edge 18 of bottom 12 and extends generally perpendicular to bottom 12. First bracket 26 further comprises a transverse top lip 30 which extends generally perpendicular to the top of sidewall 28 and generally parallel to bottom 12. The distance "D" between the upper surface 13 of bottom 12 and the lower surface 31 of top lip 30 is dimensioned to be slightly larger than the height of the edge connector to be retained in the frame 10. Similarly, second bracket 36 comprises a sidewall 38 which is affixed along second edge 20 of bottom 12 and extends generally perpendicular to bottom 12. Second bracket 36 further comprises a transverse top lip 40 which extends generally perpendicular to the top of sidewall 38 and generally parallel to bottom 12. The distance "D" between the upper surface 13 of bottom 12 and the lower surface 41 of top lip 40 is dimensioned to be slightly larger than the height of the edge connector to be retained in the frame 10.

Referring particularly to FIG. 5, there is illustrated at 100 a conventional edge connector having a body member 102 and an interior set of female connector members 104 to accommodate the prongs or pins from a disk drive. The edge connector 100 can be any conventional edge connector such as a 20 pin connector, a 34 pin connector or a 50 pin connector. Protruding from the top and adjacent the rear of the body member 102 is a flexible cable 106 which is attached to another connector member (not shown) at its other end which in turn is connected to a printed circuit board.

Referring particularly to FIG. 4, there is illustrated an edge connector 100 placed inside and retained within the present invention frame 10. Each specific frame 10 is sized to accommodate a specific size edge connector. In the preferred embodiment, the frames 10 most commonly used are sized to fit a conventional 20 pin edge connector, a conventional 34 pin edge connector, and a conventional 50 pin edge connector. In each case, the edge connector fits the same way in the specifically sized frame. The lower surface 108 of edge connector 100 rests on the bottom 12 of the frame 10. The height "H" of the edge connector is just smaller than the distance D between the lower surface of the top lips of each respective side edge bracket and the top surface 13 of bottom 12 of the frame 10. Therefore, there is a press fit to snugly retain the edge connector between the top lips and the bottom of the frame. The front 103 of edge connector 100 is flush with the front lip 22 which thereby prevents the edge connector 100 from sliding out of the frame. The female connector members 104 are positioned such that they are above the front lip 22 and therefore the front lip 22 does not interfere with the the ability of the female connector members 104 to receive the male prongs from the mating disk drive. The frame 10 is mounted on the printed circuit board 200 by insertion of an attaching means such as a bolt 150 through a slot 204 in the printed circuit board adjacent the board's front edge 202 and through transverse opening 24 in frame 10 and is secured by a nut 152. Alternatively, the attaching means may include threads 154 in the wall of opening 24 and the bolt is thereby screwed into the frame bottom 12. A critical feature of the present invention is that the frame 10 is secured beneath the printed circuit board 200 such that the front edge 202 of the printed circuit board acts as a rear lip against the lower rear wall 110 of the edge connector 100 to thereby prevent the edge connector from falling or sliding out of the frame 10.

A sample of a printed circuit board 200 with which the present invention is used is illustrated in FIGS. 1 and 2. A key feature of the present invention is that the printed circuit board 200 is modified to include a pair of slots 204 and 220 adjacent one edge 202 (usually the front edge) along which the edge connector 100 will be placed. Each slot 204 and 220 runs for a given length adjacent the edge 202 such that the location of the frame 10 affixed within a respective slot 204 and 220 can be modified to position the frame and the edge connector retained therein at any desired location along the length of edge 202 to thereby accommodate the specific locations of mating male prongs from a disk drive to be inserted into the female connector members 104 of the edge connector 100. As illustrated in the top plan view of FIG. 1 and the bottom plan view of FIG. 2, after the edge connector 100 is placed in the frame 10 a previously described, the frame is affixed to the printed circuit board 200 by insertion of the attaching means 150 (such as a bolt) through the slot (204 or 220) and then through transverse opening 24 and then locked in place. As illustrated in FIGS. 1, 2 and 4, the frame 10 is affixed beneath the printed circuit board 200 such that edge 202 acts as a rear lip to retain the edge connector 100 between the front lip 22 of frame 10 and the rear edge 202 of printed circuit board 200. Each of the two edge connectors is retained in the frame and on the printed circuit board in this manner. The two edge connectors selected are selected to accommodate the specific disk drive and are most commonly any two out of the election of 20 pin, 34 pin and 50 pin edge connectors. In each case, the attaching means such as the bolt 150 is placed through the slot in the printed circuit board and then through the transverse opening 24 and then lightly attached by nut 152 so that the frame 24 is slidably along the length of the slot (204 or 220). When the disk drive prongs are positioned adjacent the two edge connectors, the proper location for each of the edge connectors along their respective slots can be determined and the frame and retained edge connector is then slid to the appropriate location along each of the respective slots and then the nut 152 is tightened to retain the frame 10 and associated edge connector 100 at that position. Alternatively, the attaching means may be threads 154 in the wall of transverse opening 24 and the bolt 150 is threaded into frame bottom 12. As can be seen from FIG. 1, the open top of the frame 10 which retained the edge connector 100 only by top lips 30 and 40 permits the flexible cable 106 to be attached to a mating connector 240 on the printed circuit board. Therefore, this cable can be connected before the disk drive is connected and therefore multiple disk drives can be tested one after the other by insertion into the fixed edge connector without the necessity of adjusting or unplugging and replugging the flexible cable.

Through use of the present invention, the advantages of an edge connector in providing for sliding movement of the male pins of the disk drive into the female mating members and elimination of a possible backwards connection are gained and combined with the flexibility of a flexible cable connector to enable the edge connector to be moved to any location adjacent the edge to be aligned with the prongs of a given disk drive configuration.

In the preferred embodiment, the frame 10 is made of one piece construction such that the bottom 12, transverse side brackets 26 and 36 and front lip 22 are all formed from one piece. The frame 10 can be made of metal such as aluminum, tin, steel, etc. and may be stamped to the desired shape. The frame may also be made of other material such as plastic and thereby molded to the desired shape.

Defined broadly, the present invention is an assembly for retaining and mounting on a printed circuit board an edge connector, the assembly comprising:

a. an elongated slot running parallel to and adjacent one edge of the printed circuit board and extending through the entire thickness of the printed circuit board;

b. means for retaining the edge connector including a frame for holding the edge connector; and c. attaching means for attaching the frame to the elongated slot in the printed circuit board in a manner by which the edge of the printed circuit board adjacent the elongated slot serves to act as a lip for retaining the edge connector within the frame.

The present invention may further be defined as an assembly for retaining and mounting on a printed circuit board a pair of edge connectors each having a multiplicity of female connector members, the assembly comprising:

a. a first elongated slot running parallel to and adjacent one edge of the printed circuit board and extending through the entire thickness of the printed circuit board;

b. a second elongated slot running parallel to and adjacent the same edge of the printed circuit board, spaced apart from the first elongated slot, and extending through the entire thickness of the printed circuit board;

c. first means for retaining a first edge connector including a frame for holding the first edge connector such that the edge connector and female connector members extend outwardly from the edge of the printed circuit board adjacent the slot;

d. second means for retaining a second edge connector including a frame for holding the second edge connector such that the edge connector and female connector members extend outwardly from the edge of the printed circuit board adjacent the slot;

e. first attaching means for attaching the frame of said first means for retaining a first edge connector at a location along the length of the first elongated slot in the printed circuit board in a manner by which the edge of the printed circuit board adjacent the elongated slot serves to act as a lip for retaining the edge connector within the frame; and f. second attaching means for attaching the frame of said second means for retaining a second edge connector at a location along the length of the second elongated slot in the printed circuit board in a manner by which the edge of the printed circuit board adjacent the elongated slot serves to act as a lip for retaining the edge connector within the frame;

g. whereby said first means for retaining said first edge connector and said second means for retaining said second edge connector are aligned to correspond to a pair of mating prongs of a disk drive such that one of the prongs is received by the female connector members of the first edge connector and the second of the prongs is received by the female connector members of the second edge connector and thereafter the first and second means are attached to the printed circuit board within their respective elongated slots.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus is intended only for illustration and for disclosure of an operative embodiment and not to show all of the various forms or modification in which the invention might be embodied or operated.

The invention has been described in considerable detail in order to comply with the patent laws by providing full public disclosure of at least one of its forms. However, such detailed description is not intended in any way to limit the broad features or principles of the invention, or the scope of patent monopoly to be granted.

What is claimed is:

1. A frame for retaining and mounting on a printed circuit board an edge connector having a multiplicity of female connector members, the printed circuit board including at least one elongated slot running adjacent an edge of the printed circuit board, the frame comprising:
    a. a bottom including a front edge, a rear edge, a first side edge and a second side edge;
    b. a front lip affixed along said front edge of said bottom and extending generally perpendicular to the front edge;
    c. a transverse opening extending through the bottom at a location adjacent said rear edge of said bottom;
    d. a first side bracket having a sidewall affixed to said first side edge of said bottom and extending generally perpendicular to the side edge and a top lip affixed to the sidewall at a location remote from the bottom and extending generally perpendicular to the side wall and generally parallel to the bottom;
    e. a second side bracket having a sidewall affixed to said second side edge of said bottom and extending generally perpendicular to the side edge and a top lip affixed to the sidewall at a location remote from the bottom and extending generally perpendicular to the side wall and generally parallel to the bottom; and
    f. the top lips of each respective first and second side bracket extending toward each other and over the bottom;
    g. attaching means for attaching the frame to the printed circuit board;
    h. whereby said edge connector is retained within said frame such that the edge connector rests between the bottom and the top lip of the first and second side brackets, the front of the edge connector lies adjacent the front lip and the female connector members are unobstructed by the front lip, and the frame is attached to the printed circuit board by attaching means which extend through the slot in the printed circuit board and through the transverse opening in the frame with the frame affixed beneath the printed circuit board such that the edge of the printed circuit board adjacent the slot functions as a rear lip to retain the edge connector between the front lip of the frame and the printed circuit board.

2. A frame member in accordance with claim 1 wherein the frame member is of one piece construction.

3. A frame member in accordance with claim 2 wherein said frame member is made of metal.

4. A frame member in accordance with claim 1 wherein said frame member is sized to retain a 20 pin edge connector.

5. A frame member in accordance with claim 1 wherein said frame member is sized to retain a 34 pin edge connector.

6. A frame member in accordance with claim 1 wherein said frame member is sized to retain a 50 pin edge connector.

7. An assembly for retaining and mounting on a printed circuit board an edge connector having a multiplicity of female connector members, the assembly comprising:
    a. an elongated slot running parallel to and adjacent one edge of the printed circuit board and extending through the entire thickness of the printed circuit board;
    b. a frame member further comprising,
        (i) a bottom including a front edge, a rear edge, a first side edge and a second side edge;
        (ii) a front lip affixed along said front edge of said bottom and extending generally perpendicular to the front edge;
        (iii) a transverse opening extending through the bottom at a location adjacent said rear edge of said bottom;
        (iv) a first side bracket having a sidewall affixed to said first side edge of said bottom and extending generally perpendicular to the side edge and a top lip affixed to the sidewall at a location remote from the bottom and extending generally perpendicular to the side wall and generally parallel to the bottom;
        (v) a second side bracket having a sidewall affixed to said second side edge of said bottom and extending generally perpendicular to the side edge and a top lip affixed to the sidewall at a location remote from the bottom and extending generally perpendicular to the side wall and generally parallel to the bottom;
        (vi) the top lips of each respective first and second side bracket extending toward each other and over the bottom; and
        (vii) attaching means for attaching the frame to the printed circuit board;
    c. whereby said edge connector is retained within said frame such that the edge connector rests between the bottom and the top lip of the first and second side brackets, the front of the edge connector lies adjacent the front lip and the female connector members are unobstructed by the front lip, and the frame is attached to the printed circuit board by attaching means which extend through the slot in the printed circuit board and through the transverse opening in the frame with the frame affixed beneath the printed circuit board such that the edge of the printed circuit board adjacent the slot functions as a rear lip to retain the edge connector between the front lip of the frame and the printed circuit board.

8. An assembly in accordance with claim 7 wherein the frame member is of one piece construction.

9. An assembly in accordance with claim 8 wherein said frame member is made of metal.

10. An assembly in accordance with claim 7 wherein said frame member is sized to retain a 20 pin edge connector.

11. An assembly in accordance with claim 7 wherein said frame member is sized to retain a 34 pin edge connector.

12. A frame member in accordance with claim 7 wherein said frame member is sized to retain a 50 pin edge connector.

13. An assembly for retaining and mounting on a printed circuit board a pair of edge connectors each having a multiplicity of female connector members, the assembly comprising:
 a. a first elongated slot running parallel to and adjacent one edge of the printed circuit board and extending through the entire thickness of the printed circuit board;
 b. a second elongated slot running parallel to and adjacent the same edge of the printed circuit board, spaced apart from the first elongated slot, and extending through the entire thickness of the printed circuit board;
 c. a first frame member further comprising,
  (i) a bottom including a front edge, a rear edge, a first side edge and a second side edge;
  (ii) a front lip affixed along said front edge of said bottom and extending generally perpendicular to the front edge;
  (iii) a transverse opening extending through the bottom at a location adjacent said rear edge of said bottom;
  (iv) a first side bracket having a sidewall affixed to said first side edge of said bottom and extending generally perpendicular to the side edge and a top lip affixed to the sidewall at a location remote from the bottom and extending generally perpendicular to the side wall and generally parallel to the bottom;
  (v) a second side bracket having a sidewall affixed to said second side edge of said bottom and extending generally perpendicular to the side edge and a top lip affixed to the sidewall at a location remote from the bottom and extending generally perpendicular to the side wall and generally parallel to the bottom;
  (vi) the top lips of each respective first and second side bracket extending toward each other and over the bottom; and
  (vii) attaching means for attaching the frame to the printed circuit board at a location along the length of the first elongated slot in the printed circuit board in a manner by which the edge of the printed circuit board adjacent the first elongated slot serves to act as a lip for retaining the edge connector within the frame;
 d. a second frame member further comprising,
  (i) a bottom including a front edge, a rear edge, a first side edge and a second side edge;
  (ii) a front lip affixed along said front edge of said bottom and extending generally perpendicular to the front edge;
  (iii) a transverse opening extending through the bottom at a location adjacent said rear edge of said bottom;
  (iv) a first side bracket having a sidewall affixed to said first side edge of said bottom and extending generally perpendicular to the side edge and a top lip affixed to the sidewall at a location remote from the bottom and extending generally perpendicular to the side wall and generally parallel to the bottom;
  (v) a second side bracket having a sidewall affixed to said second side edge of said bottom and extending generally perpendicular to the side edge and a top lip affixed to the sidewall at a location remote from the bottom and extending generally perpendicular to the side wall and generally parallel to the bottom;
  (vi) the top lips of each respective first and second side bracket extending toward each other and over the bottom; and
  (vii) attaching means for attaching the frame to the printed circuit board at a location along the length of the second elongated slot in the printed circuit board in a manner by which the edge of the printed circuit board adjacent the second elongated slot serves to act as a lip for retaining the edge connector within the frame;
 e. whereby each edge connector is retained within its respective frame such that the edge connector rests between the bottom and the top lip of the first and second side brackets, the front of the edge connector lies adjacent the front lip and the female connector members are unobstructed by the front lip, and the frame is attached to the printed circuit board by attaching means which extend through the slot in the printed circuit board and through the transverse opening in the frame with the frame affixed beneath the printed circuit board such that the edge of the printed circuit board adjacent the slot functions as a rear lip to retain the edge connector between the front lip of the frame and the printed circuit board and whereby said first frame and said second frame are aligned to correspond to a pair of mating prongs of a disk drive such that one of the prongs is received by the female connector members of one edge connector and the second of the prongs is received by the female connector members of the other edge connector and thereafter the first and second frames are attached to the printed circuit board within their respective elongated slots.

* * * * *